United States Patent
Saito et al.

(10) Patent No.: US 7,517,554 B2
(45) Date of Patent: Apr. 14, 2009

(54) PROCESS FOR PRODUCING NANOSTRUCTURE OF MIXED FILM OF AL, SI, AND/OR GE

(75) Inventors: Tatsuya Saito, Ebina (JP); Tohru Den, Tokyo (JP); Kazuhiko Fukutani, Santa Cruz, CA (US); Aya Imada, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 254 days.

(21) Appl. No.: 11/339,627

(22) Filed: Jan. 26, 2006

(65) Prior Publication Data

US 2006/0127602 A1    Jun. 15, 2006

Related U.S. Application Data

(63) Continuation of application No. PCT/JP2004/011647, filed on Aug. 6, 2004.

(51) Int. Cl.
  *C23C 8/00* (2006.01)
(52) U.S. Cl. .............. 427/126.1; 427/255.35; 427/585; 204/192.1
(58) Field of Classification Search .......... 427/126.1, 427/255.35, 585; 204/192.1
  See application file for complete search history.

(56) References Cited

U.S. PATENT DOCUMENTS

| | | | | |
|---|---|---|---|---|
| 4,710,348 A | * | 12/1987 | Brupbacher et al. | 420/129 |
| 6,334,939 B1 | * | 1/2002 | Zhou et al. | 204/409 |
| 6,410,170 B1 | | 6/2002 | Chen et al. | 428/692 |
| 7,001,669 B2 | * | 2/2006 | Lu et al. | 428/613 |
| 7,183,127 B2 | * | 2/2007 | Kuriyama et al. | 438/34 |
| 7,192,510 B2 | * | 3/2007 | Den et al. | 205/171 |
| 2003/0043208 A1 | | 3/2003 | Staelin et al. | 345/826 |
| 2003/0048092 A1 | | 3/2003 | Chu | 320/107 |
| 2003/0175472 A1 | | 9/2003 | Den et al. | 428/66.6 |

FOREIGN PATENT DOCUMENTS

| WO | WO 03/078685 | 9/2003 |
|---|---|---|
| WO | WO 03/078687 | 9/2003 |

OTHER PUBLICATIONS

Maksimovic, Vesna, et al., "The effects of microalloying with silicon and germanium on microstructure and hardness of a commercial aluminum alloy." J.Serb.Chem.Soc. 68 (11) pp. 893-901, 2003.*

(Continued)

*Primary Examiner*—Bret Chen
(74) *Attorney, Agent, or Firm*—Fitzpatrick, Cella, Harper & Scinto

(57) ABSTRACT

A process for producing a nano-structure is provided which enables control of the pore diameters and the pore intervals by film formation conditions. The process produces a nano-structure of an aluminum-silicon-germanium mixed film containing silicon and germanium at a content of 20 to 70 atom % relative to aluminum, the mixed film being constituted of a matrix composed mainly of silicon and germanium in a composition ratio of $Si_xGe_{1-x}$ ($0 \leq X \leq 1$), and cylindrical portions mainly composed of aluminum having a diameter of not larger 30 nm in the matrix. In the process, the mixed film is formed at a film-forming rate of not higher than 150 nm/min.

9 Claims, 2 Drawing Sheets

OTHER PUBLICATIONS

Fukutani, Kazuhiko, et al., "Nanowire array fabricated by Al-Ge phase separation." Thin Solid Films, 515 (2007) pp. 4629-4635.*

Shah et al., "Fabrication and Characterization of $Ge_xAl_{1-x}$ Thin Films", Nano-structured Materials, vol. 2, No. 2, pp. 149-156 (1993).

Konno et al., "Crystallization and . . . thin films", Materials Chemistry and Physics, vol. 35, 99-113 (1993).

Catalina et al., "Electrical Resistivity . . . Under Thermal Annealing", Thin Solid Films, vol. 167, pp. 57-65 (1988).i.

Fukutani et al., "Template-assisted growth . . . nano phase separation", Mat. Res. Soc. Symp. Proc., vol. 818, M11.25.1-M11.25.6 (2004).

Paulose et al., "Self-assembled fabrication . . . nanonwire netoworks", Appl. Phys. Letters, vol. 81, No. 1, pp. 153-155 (2002).

* cited by examiner

PROCESS FOR PRODUCING NANOSTRUCTURE OF MIXED FILM OF AL, SI, AND/OR GE

TECHNICAL FIELD

The present invention relates to a nano-structure which has cylinders of aluminum vertical to a film face and separated by a partition wall of silicon-germanium, germanium or silicon, and relates also to a process for producing the nano-structure.

The present invention relates also to a nano-structure having fine pores formed by dissolving the above-mentioned aluminum cylinders, and to a process for producing the nano-structure.

BACKGROUND ART

With recent remarkable progress of fine working technique, nano-technology is attracting attention in various fields. For example, high-function materials having nano-scale structure such as quantum wires and quantum dots are investigated actively.

Conventionally, nano-structures having nano-scale construction have been formed by utilizing artificial nano-structure technique of the semiconductor processes such as photolithography, electron ray exposure, and X-ray exposure. However, these conventional semiconductor techniques are considered to be not suitable for easy formation of very fine structure of several tens of nanometers or less in a large area in view of production yields and through put. On the other hand, a natural formation technique, namely a technique utilizing self-organization phenomenon of a material, is considered to be useful as the technique for forming a finer structure simply in a larger area in comparison with the conventional semiconductor process.

The process for producing the nano-structure by utilizing the self-organization phenomenon is exemplified by anodization of aluminum and anodization of silicon.

In anodization of aluminum, a porous anodization film of aluminum can be obtained by anodization of an aluminum substrate in a solution of an acidic electrolyte such as sulfuric acid, oxalic acid, and phosphoric acid (R. C. Furneaux, W. R. Rigby, & A. P. Davidson, Nature, vol. 337, p. 147, 1989). This porous anode-oxidation film is characterized by the specific geometrical construction thereof in which very fine cylindrical pores of several to several hundreds of nanometers in diameter are partitioned by alumina partition wall at intervals of several tens to several hundreds of nanometers and are arranged in a parallel direction. The obtained cylindrical pores have a high aspect ratio and have excellent uniformity in depth and sectional diameters. The construction of the porous anodization film can be controlled to some extent by controlling the anodization conditions. For example it is known that the intervals between fine pores can be controlled by anodization voltage, the pore depth can be controlled by anodization time, the pore diameter can be controlled by etching treatment of partitioning alumina with phosphoric acid.

By anodization, porous silicon is formed by employing a p-type silicon substrate as the anode and applying a voltage in an aqueous hydrofluoric acid solution (D. R. Turner, J. Electrochem. Soc., 105, 402, 1985). This porous silicon has numerous fine pores of 1 nm to several tens of nanometers in diameter: the diameter and shape of the pores can be varied by controlling the anodization conditions.

The fine pores filled with a metal or a semiconductor are promising in various applications such as magnetic recording medium, magnetic sensors, EL light emitting elements, electrochromic elements, optical elements, solar cells, and gas sensors.

Many studies have been made on the nano-structure formed by self-organization phenomenon as mentioned above. However, in anode-oxidized alumina of pore intervals of less than 10 nm, the formed pores are not perpendicular to the substrate, rendering the partition wall defective, and making it extremely difficult to partition the respective pores to be independent by the partition wall. On the other hand, in anodization of silicon, the kind of the substrate is limited, and the pores tend to become branched.

The present invention intends to provide a process for producing the nano-structure having pore diameters and pore intervals controllable to some extent without changing the composition ratio of the aluminum-silicon-germanium mixed film, the aluminum-silicon mixed film, or the aluminum-germanium mixed film.

DISCLOSURE OF THE INVENTION

The above objects can be achieved by the present invention as below.

According to an aspect of the present invention, there is provided a process for producing a nano-structure which is comprised of a matrix comprised of silicon, germanium, or silicon-germanium and cylindrical portions comprised of aluminum not larger 30 nm, preferably not less than 1 nm in diameter and having the longitudinal direction perpendicular to a substrate, the process comprising the step of forming a mixed film of $Al_x(Si_yGe_{1-y})_{1-x}$ ($0.3 \leq X \leq 0.8$, $0 \leq Y \leq 1$) on the substrate by using aluminum and silicon, aluminum and germanium, or aluminum, silicon and germanium as the source materials, at a film-forming rate of not higher than 150 nm/min, more preferably not higher than 100 nm/min, and further more preferably not higher than 20 nm/min.

In the process for producing a nano-structure, a bias is preferably applied to the substrate in the step of forming the mixed film. The bias is preferably a DC bias to keep the potential of the substrate to be not higher than −20 V relative to the earth potential.

In the process for producing the nano-structure, the gas pressure in the step of forming the mixed film is preferably not higher than 2.0 Pa, more preferably not higher than 1.0 Pa, and further more preferably not higher than 0.2 Pa.

In the process for producing the nano-structure, the process preferably further comprises the step of removing the cylinder portions after formation of the mixed film of $Al_x(Si_yGe_{1-y})_{1-x}$ ($0.3 \leq X \leq 0.8$, $0 \leq Y \leq 1$).

According to another aspect of the present invention, there is provided a nano-structure produced by the above production process.

BEST MODE FOR CARRYING OUT THE INVENTION

Embodiments of the present invention are described below in detail.

[Process for Producing Nano-Structure]

Firstly, the process for producing the nano-structure of the present invention is described by using $Al_xSi_{1-x}$ ($0.3 \leq X \leq 0.8$) mixed film (aluminum-silicon mixed film).

Figure 1:
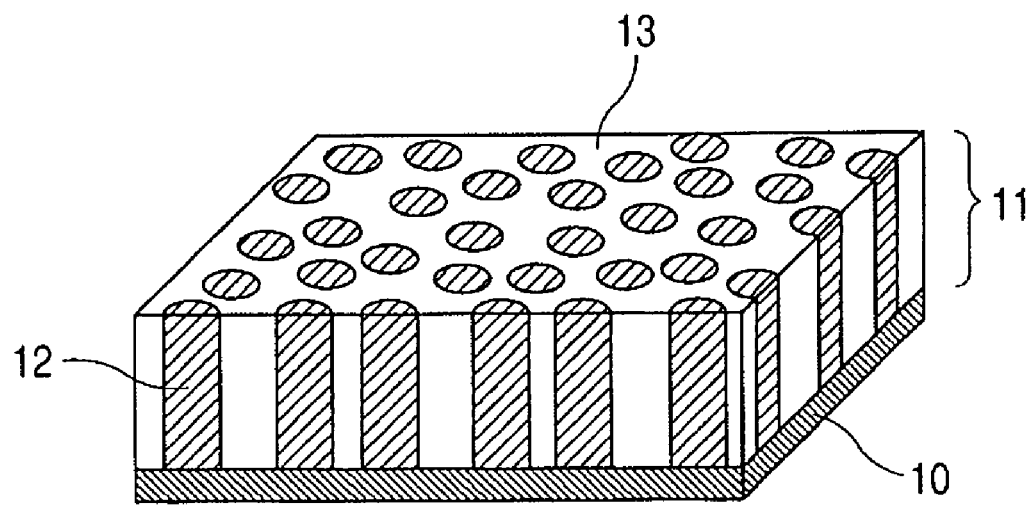
FIG. 1 is a schematic drawing of an aluminum-silicon mixed film of the present invention.

In formation of an aluminum-silicon mixed film in a non-equilibrium state, the film grows with separation of the components of aluminum and silicon to give a structure in which cylindrical aluminum portions 12 are separated by a silicon partition wall 13 as shown in FIG. 1. In this structure, the cylindrical aluminum portions 12 may contain a small amount of silicon, and the silicon partition wall portion 13 may contain a small amount of aluminum.

In order to obtain the aluminum-silicon mixed film constituted of separated components as shown in FIG. 1, the ratio of silicon in the film should be within the range of 20 to 70 atom %. Here the term "atom %" signifies the percentage of atoms contained in the film. This atom % can be determined quantitatively, for example, by ICP (inductive coupled plasma emission spectroscopy).

Depending on the composition of the film, generally, the diameters of the cylindrical aluminum are within the range of 2 to 10 nm, and the intervals thereof are not more than 15 nm.

The process for forming the aluminum-silicon mixed film is not specially limited insofar as the process is capable of forming the film in a nonequilibrium state on a substrate, including sputtering methods. The sputtering methods include several methods such as simultaneous sputtering by use of an aluminum target and a silicon target; sputtering by use of a mixture target obtained by baking of aluminum and silicon; and sputtering by use of an aluminum target having a silicon chip placed thereon. However, the sputtering method is not limited thereto.

Figure 2:
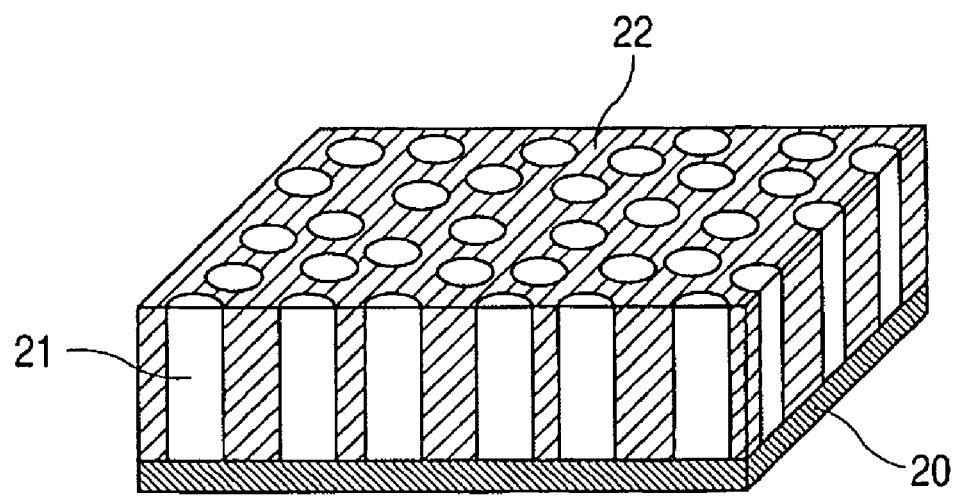
FIG. 2 is a schematic drawing of pores formed from the aluminum-silicon mixed film of the present invention.

Further, a nano-structure having pores 21 as shown in FIG. 2 can be formed by dissolving the cylindrical aluminum portions by anodization or etching of the nano-structure shown in FIG. 1.

The compositionally separated aluminum-silicon mixed film as shown schematically in FIG. 1 is formed by surface diffusion of aluminum atoms and silicon atoms on the substrate surface. Specifically, in the film-forming process, the aluminum atoms and the silicon atoms having reached the substrate respectively move (diffuse) several to several tens of nanometers on the substrate to reach thermodynamically stable sites. In this diffusion, the same kind of atoms flocculate together to decrease the interface between the aluminum and the silicon since aluminum-silicon in the solid is an eutectic alloy to form the compositionally separated film as shown in FIG. 1.

In consideration of the mechanism of formation of the aluminum-silicon mixed film, the diameters and intervals of the aluminum cylinders can be changed by controlling the diffusion distances of the aluminum atoms and silicon atoms on the substrate. Specifically, the diameters and intervals of the aluminum cylinders can be increased by increasing the diffusion distance, whereas the diameters and intervals of the aluminum cylinders can be decreased by decreasing the diffusion distance. In the present invention, the diameters and intervals of the aluminum cylinders can be controlled by controlling the surface diffusion of the atoms by film-forming conditions.

In the aluminum-silicon-germanium mixed film, and the aluminum-germanium mixed film, a compositionally separated nano-structure can be formed in the same mechanism as in the formation of the aluminum-silicon mixed film. In these films also, the percentage of silicon-germanium or germanium should be respectively in the range of 20 to 70 atom %. The formed aluminum cylinders have diameters in the range of 1 to 30 nm and intervals of not more than 30 nm in the aluminum-silicon-germanium film, and diameters in the range of 1 to 20 nm and intervals of not more than 30 nm in the aluminum-germanium mixed film.

EXAMPLES

The present invention is described below in more detail by reference to examples.

Example 1

In this example, investigation was made on dependence of the diameters and intervals of the aluminum cylinders of an aluminum-silicon mixed film on the film-forming rate.

An aluminum-silicon mixed film was formed on an Si(100) substrate by sputtering by use of a mixture target of 50.8 mm (2 inches) in diameter formed by baking of aluminum and silicon. The aluminum-silicon mixed film formed with this target was subjected to quantitative determination of the composition ratio by ICP to obtain 44 atom % of the ratio of silicon in the film. The sputtering was conducted with an RF power source at argon gas pressure of 1.0 Pa, and at room temperature by changing the input power in the range of 1.2 to 12 $W/cm^2$ to change the film-forming rate. In the example, the sputtering was conducted with the substrate kept unmoved just above the target to show clearly the difference caused by the film-forming rate.

After the film formation, to show clearly the diameters of the aluminum cylinders, the aluminum cylinders were dissolved out by wet etching with an aqueous 5 wt % phosphoric acid solution at 20° C. to obtain pores as shown in FIG. 2. The surface of the sample was observed by FE-SEM (field emission scanning electron microscopy). The thickness of the film was measured by examining the cross-section of the sample. Thereby the film-forming rates were calculated for the respective input powers.

Table 1 shows the average pore diameter and the average pore interval of the etched sample measured by a planar FE-SEM image of the sample.

TABLE 1

| Input power | 1.2 $W/cm^2$ | 3.0 $W/cm^2$ | 6.0 $W/cm^2$ | 12 $W/cm^2$ |
|---|---|---|---|---|
| Film-forming rate | 8 nm/min | 20 nm/min | 50 nm/min | 100 nm/min |
| Pore diameter | 7 nm | 5 nm | 4 nm | 3 nm |
| Pore interval | 11 nm | 8 nm | 7 nm | 6 nm |

As shown above, the diameters and intervals of the pores, namely the diameters and intervals of the aluminum cylinders are made smaller by increase of the film-forming rate. The higher film-forming rate means a higher rate of deposition of the sputtered particles, which presumably shortens the time for surface diffusion of the sputtered particles so that the sufficient surface diffusion of the sputtered particles is not allowed.

Being not shown in Table 1, at a higher film forming rate than 150 nm/min, no aluminum-silicon mixed film having compositionally separated construction as shown in FIG. 1 could be obtained. Therefore, the film-forming rate should not be higher than 150 nm/min, preferably is not higher than 100 nm/min to obtain the aluminum-silicon mixed film having the compositionally separated construction.

As described above, the diameters and intervals of the aluminum cylinders in the aluminum-silicon film formed can be changed by changing the film-forming rate without changing the composition of the target according to this example.

Example 2

In this example, the same investigation was made as in Example 1 except that the argon gas pressure in the sputtering was changed to 0.2 Pa.

Firstly, an aluminum-silicon mixed film was formed on an Si(100) substrate. The target used was the same as the one in Example 1. The sputtering was conducted by application of an RF power at an argon gas pressure of 0.2 Pa at room temperature. The input power was changed in the range of 1.2 to 12 W/cm$^2$ to change the film-forming rate. During the sputtering, the substrate was kept unmoved just above the target in the same manner as in Example 1.

After the film formation, the aluminum cylinders were dissolved out by wet etching with an aqueous 5 wt % phosphoric acid solution at 20° C. to form pores. The surface and cross-section of the sample were observed by FE-SEM.

Table 2 shows the average diameter and the average interval of the pores measured by a planar FE-SEM image of the etched sample together with the film-forming rate.

TABLE 2

| Input power | 1.2 W/cm$^2$ | 3.0 W/cm$^2$ | 6.0 W/cm$^2$ | 12 W/cm$^2$ |
|---|---|---|---|---|
| Film-forming rate | 5 nm/min | 15 nm/min | 30 nm/min | 80 nm/min |
| Pore diameter | 10 nm | 10 nm | 7 nm | 4 nm |
| Pore interval | — | 15 nm | 10 nm | 9 nm |

Figure 3:
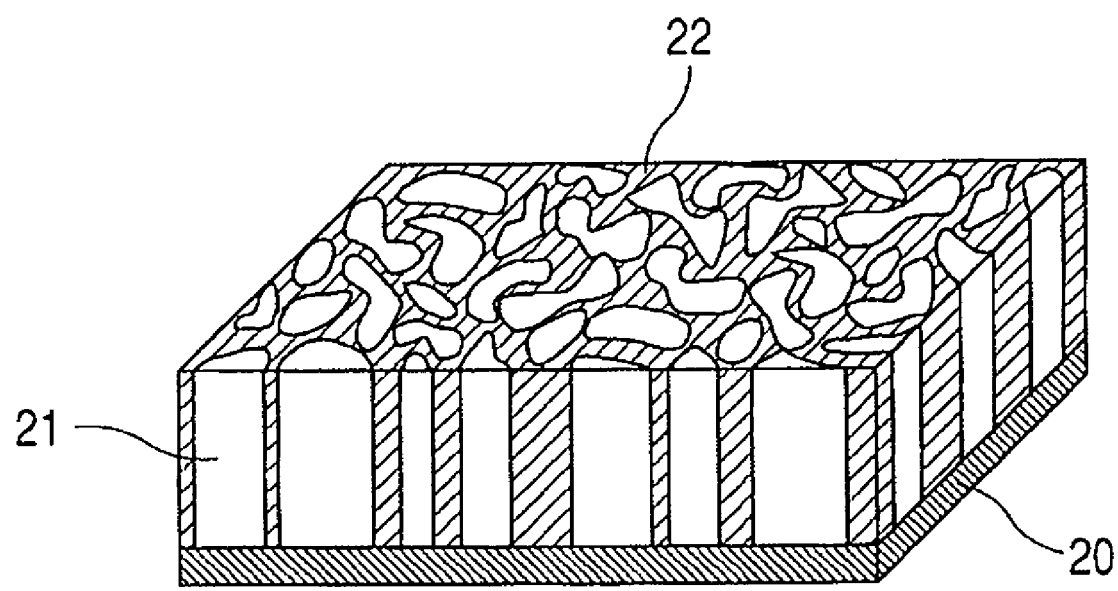
FIG. 3 is a schematic drawing of pores formed from the aluminum-silicon mixed film of the present invention.

In the film formed at the input power of 1.2 W/cm$^2$, cylindrical pores like the ones shown in FIG. 2 were not formed, but most of the pores were in a shape of joined pores as shown in FIG. 3, coexisting with a smaller number of cylindrical pores. The diameter and shape of the pores in this sample were dispersed significantly; the smaller pores having a diameter of 10 nm, and the joined pores having a diameter of larger than 10 nm. The average pore interval could not be defined owing to the irregular shapes and nonuniform pore distribution.

In the other samples prepared in this Example, cylindrical pores as shown in FIG. 2 were formed, and dependence of the pore diameter on the film-forming rate was confirmed as in Example 1. The decrease of the argon pressure lowers the film-forming rate, resulting in larger pore diameters than in Example 1.

As shown above, in this Example, it was confirmed that the diameters and intervals of aluminum cylinders formed in the aluminum-silicon film can be changed by controlling the film-forming rate and the argon gas pressure without changing the composition of the target.

Example 3

In this example, the same investigation was made as in Example 2 except that the argon gas pressure in the sputtering was changed to 2.0 Pa.

An aluminum-silicon mixed film was formed on an Si(100) substrate. The target used was the same as the one in Example 1. The sputtering was conducted by application of an RF power at an argon gas pressure of 2.0 Pa at room temperature, and with the input power changed in the range of 1.2 to 12 W/cm$^2$ to change the film-forming rate. During the sputtering, the substrate was kept unmoved just above the target in the same manner as in Examples 1 and 2.

After the film formation, the aluminum cylinders were dissolved out by wet etching with an aqueous 5 wt % phosphoric acid solution at 20° C. to form pores. The surface and cross-section of the sample were observed by FE-SEM.

Table 3 shows the average diameter and the average interval of the pores of the etched sample measured by a planar FE-SEM image together with the film-forming rate.

TABLE 3

| Input power | 1.2 W/cm$^2$ | 3.0 W/cm$^2$ | 6.0 W/cm$^2$ | 12 W/cm$^2$ |
|---|---|---|---|---|
| Film-forming rate | 5 nm/min | 12 nm/min | 30 nm/min | 150 nm/min |
| Pore diameter | 5 nm | 5 nm | 3 nm | 2 nm |
| Pore interval | 8 nm | 8 nm | 6 nm | 5 nm |

In all the samples, cylindrical pores like the ones as shown in FIG. 2 were formed, and dependence of the pore diameter on the film-forming rate was confirmed as in Examples 1 and 2. The increase of the argon pressure improved the film-forming rate in comparison with Examples 1 and 2, resulting in smaller pore diameters than in Examples 1 and 2.

As shown above, in this Example, it was confirmed that the diameters and intervals of aluminum cylinders in the aluminum-silicon film formed can be changed by controlling the film-forming rate and the argon gas pressure without changing the composition of the target.

Example 4

In this Example, investigation was made on the mixing of silicon into the cylindrical aluminum, and mixing of aluminum into the silicon matrix portion in the aluminum-silicon mixed film of the present invention.

An aluminum-silicon mixed film was formed on a quartz substrate. The target was the same as the one used in Example 1. The sputtering was conducted by application of an RF power at room temperature. Three samples were prepared under the conditions as shown in Table 4. In view of the investigation in Examples 1 to 3, Sample A was a product formed at a lower film-forming rate with sufficient surface diffusion on the substrate surface; Sample C was a product formed with insufficient surface diffusion; and Sample B was an intermediate product.

All of the samples were prepared in a film thickness of 300 nm. The films were wet-etched with an aqueous 5 wt % phosphoric acid at 20° C. for a prescribed time to dissolve the aluminum cylinders to form pores. The etching rate was calculated by observation of cross-section of the sample by FE-SEM.

Table 4 shows the results.

TABLE 4

| | Sample | | |
|---|---|---|---|
| | A | B | C |
| Input power | 1.2 W/cm$^2$ | 3.0 W/cm$^2$ | 12 W/cm$^2$ |
| Argon gas pressure | 0.2 Pa | 1.0 Pa | 2.0 Pa |
| Etching rate | 2 nm/min | 1 nm/min | 0.5 nm/min |

Table 4 shows that the etching rate was higher with the sample formed with sufficient surface diffusion: the etching rate of Sample A was higher than that of Sample C by a factor of as large as 4. From the above results, it was confirmed that the insufficient surface diffusion on the substrate surface in the film formation step increases mixing of silicon into the cylinder portions mainly composed of aluminum to decrease the etching rate. In other words, the mixing of silicon into the cylinder portions is retarded by lowering the film-forming rate. Naturally, thereby the mixing of aluminum into the matrix silicon is similarly retarded.

As described above, it was confirmed that the mixing of silicon into the cylinder portions mainly composed of aluminum as well as the mixing of aluminum into the matrix silicon are retarded by lowering the film-forming rate.

Example 5

In this Example, investigation was made on application of the bias to the substrate in formation of the aluminum-silicon mixed film by sputtering.

An aluminum-silicon mixed film was formed by sputtering on an Si(100) substrate having a resistivity of 0.015 Ωcm with the target employed in Example 1. The sputtering was conducted with input RF power of 3.0 W/cm at an argon gas pressure of 1.0 Pa at room temperature with the substrate kept unmoved just above the target. In the film formation, additionally, a DC bias was applied to the substrate with a DC power source. Four samples were prepared by changing the DC bias.

The formed films were wet-etched with an aqueous 5 wt % phosphoric acid at 20° C. to dissolve the aluminum cylinders to form pores. The surface and cross-sections of the samples were observed by FE-SEM.

Table 5 shows the average diameters and average intervals of the pores of the etched samples measured by planar FE-SEM image.

TABLE 5

| DC bias | 0 V | −20 V | −40 V | −80 V |
|---|---|---|---|---|
| Pore diameter | 5 nm | 7 nm | 10 nm | 10 nm |
| Pore interval | 8 nm | 10 nm | 13 nm | — |

In Table 5, the DC bias 0 V signifies that the substrate was kept at the earth potential. Application of a larger bias increased the diameters and intervals of the formed pores. Presumably the bias applied to the substrate controls the energy or quantity of the argon ions of the plasma introduced to the substrate, and the introduced argon ions give energy to the sputtered particles on the substrate to promote the surface diffusion of the particles. The sample of the bias of −80 V had small pores of 10 nm diameter, but had scatteredly larger pores exceeding 10 nm diameter which could be formed by joining of pores. The average pore intervals of this sample could not be determined owing to the broad distribution of the diameter and varieties of the shape of the pores. Although not shown in Table 5, at a higher substrate potential than −20 V, for instance DC bias of −10 V, the diameters and intervals of the pores were nearly the same as the ones of the DC bias of 0 V.

As described in this Example, the application of a bias to the substrate enables change of the diameters and intervals of the aluminum cylinders formed in the aluminum-silicon film formed from the target of the same composition. Generally, however, a larger bias tends to cause re-sputtering from the substrate side by the argon ions more remarkably to prevent the film formation on the substrate. Therefore, the bias should be limited within the range in which the thin film can be formed on the substrate.

In Examples 1 to 5, the investigation was made with aluminum-silicon mixed films. However, with aluminum-silicon-germanium mixed films and aluminum-germanium mixed films, the diameters and intervals of the pores are confirmed to be similar to those of the aluminum-silicon mixed film, although not completely the same.

The present invention enables the adjustment of the diameters and intervals of the cylindrical portions mainly composed of aluminum in an aluminum-silicon-germanium mixed film, an aluminum-germanium mixed film and an aluminum-silicon mixed film formed from the target of the same composition. Further, removal of the cylinder portion gives pores of various shapes and diameters. Therefore, the present invention will expand the application field of the nano-structure having pores formed from the aluminum-silicon-germanium mixed film, the aluminum-germanium mixed film or the aluminum-silicon mixed film.

This application claims priority from Japanese Patent Application No. 2003-206535 filed on Aug. 7, 2003, which is hereby incorporated by reference herein.

The invention claimed is:

1. A process for producing a nano-structure which is comprised of a matrix comprised of silicon, germanium, or silicon-germanium and cylindrical portions comprised of aluminum not larger than 30 nm in diameter and having the longitudinal direction perpendicular to a substrate, the process comprising the step of forming a mixed film of $Al_x(Si_yGe_{1-y})_{1-x}$ ($0.3 \leqq X \leqq 0.8$, $0 \leqq Y \leqq 1$) on the substrate by using aluminum and silicon, aluminum and germanium, or aluminum, silicon and germanium as the source materials, at a film-forming rate of not higher than 150 nm/min.

2. The process for producing a nano-structure according to claim 1, wherein a bias is applied to the substrate in the step of forming the mixed film.

3. The process for producing the nano-structure according to claim 2, wherein the bias is a DC bias to keep the potential of the substrate to be not higher than −20 V relative to the earth potential.

4. The process for producing the nano-structure according to claim 1, wherein the gas pressure in the step of forming the mixed film is not higher than 2.0 Pa.

5. The process for producing the nano-structure according to claim 1, wherein the diameter of the cylindrical portions is not less than 1 nm, and the film forming rate is not higher than 100 nm/min.

6. The process for producing the nano-structure according to claim 1, wherein the gas pressure in the step of forming the mixed film is not higher than 1.0 Pa.

7. The process for producing the nano-structure according to claim 1, wherein the diameter of the cylindrical portions is not less than 3 nm, and the film forming rate is not higher than 20 nm/min.

8. The process for producing the nano-structure according to claim 1, wherein the gas pressure in the step of forming the mixed film is not higher than 0.2 Pa.

9. The process for producing the nano-structure according to claim 1, wherein the process further comprises the step of removing the cylinder portions after formation of the mixed film of $Al_x(Si_yGe_{1-y})_{1-x}$ ($0.3 \leqq X \leqq 0.8$, $0 \leqq Y \leqq 1$).

* * * * *